United States Patent
Park et al.

(10) Patent No.: US 11,626,159 B2
(45) Date of Patent: Apr. 11, 2023

(54) COMPUTING IN-MEMORY DEVICE SUPPORTING ARITHMETIC OPERATIONS AND METHOD OF CONTROLLING THE SAME

(71) Applicant: Korea University Research and Business Foundation, Seoul (KR)

(72) Inventors: Jongsun Park, Seoul (KR); Kyeongho Lee, Seoul (KR); Woong Choi, Bucheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 8 days.

(21) Appl. No.: 17/336,451

(22) Filed: Jun. 2, 2021

(65) Prior Publication Data
US 2021/0391001 A1    Dec. 16, 2021

(30) Foreign Application Priority Data

Jun. 12, 2020  (KR) .......................... 10-2020-0071548
Oct. 6, 2020   (KR) .......................... 10-2020-0129034

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................. G11C 11/418; G11C 11/419
USPC ....................................................... 365/154
See application file for complete search history.

(56) References Cited

U.S. PATENT DOCUMENTS

| | | | | |
|---|---|---|---|---|
| 8,995,208 | B2* | 3/2015 | Jung | G11C 11/413 365/189.11 |
| 9,824,749 | B1* | 11/2017 | Nautiyal | G11C 11/413 |
| 10,522,217 | B1* | 12/2019 | Bringivijayaraghavan | G11C 11/412 |
| 2008/0298143 | A1* | 12/2008 | Chen | G11C 7/22 365/194 |
| 2012/0140540 | A1 | 6/2012 | Agam et al. | |
| 2014/0071776 | A1* | 3/2014 | Chong | G11C 7/06 365/194 |
| 2014/0269141 | A1* | 9/2014 | Hsu | G11C 7/06 365/230.06 |

(Continued)

FOREIGN PATENT DOCUMENTS

| | | |
|---|---|---|
| KR | 10-1686340 B1 | 12/2016 |
| KR | 10-1858597 B1 | 5/2018 |
| KR | 10-2019-0114208 A | 10/2019 |

OTHER PUBLICATIONS

Agrawal, Amogh, et al. "X-SRAM: Enabling in-memory Boolean computations in CMOS static random access memories." *IEEE Transactions on Circuits and Systems I: Regular Papers* vol. 65, No. 12 (Dec. 2018): pp. 4219-4232 (14 Pages in English).

(Continued)

*Primary Examiner* — Sung Il Cho
(74) *Attorney, Agent, or Firm* — NSIP Law

(57) ABSTRACT

A computing in-memory device includes a memory cell array supporting a bitwise operation through at least one pair of memory cells activated in response to at least one pair of word line signals and a peripheral circuit connected to the at least one pair of memory cells via one pair of bit lines and performing a discharging operation on at least one bit line of the one pair of bit lines based on a voltage level of the one pair of bit lines.

18 Claims, 10 Drawing Sheets

(56) References Cited

U.S. PATENT DOCUMENTS

| | | | |
|---|---|---|---|
| 2016/0232951 A1* | 8/2016 | Shanbhag | G11C 11/419 |
| 2016/0284390 A1 | 9/2016 | Tomishima et al. | |
| 2019/0042199 A1* | 2/2019 | Sumbul | G11C 11/4091 |
| 2019/0102359 A1* | 4/2019 | Knag | G11C 11/418 |
| 2019/0103156 A1* | 4/2019 | Sumbul | G11C 7/1006 |
| 2020/0135266 A1* | 4/2020 | Kumar | G11C 11/412 |

OTHER PUBLICATIONS

Korean Office Action dated Jan. 27, 2022, in corresponding Korean Patent Application No. 10-2020-0129034 (5 pages in Korean).

* cited by examiner

COMPUTING IN-MEMORY DEVICE SUPPORTING ARITHMETIC OPERATIONS AND METHOD OF CONTROLLING THE SAME

CROSS-REFERENCE TO RELATED APPLICATION

This U.S. non-provisional patent application claims priorities under 35 U.S.C. § 119 of Korean Patent Applications Nos. 10-2020-0071548, filed on Jun. 12, 2020, and 10-2020-0129034, filed on Oct. 6, 2020, the contents of which are hereby incorporated by reference in their entirety.

BACKGROUND

1. Field of Disclosure

The present disclosure relates to a computing in-memory device that supports arithmetic operations at high speed and in parallel and a control operation method thereof.

2. Description of the Related Art

A conventional cache memory is limited to read and write operations that are relatively slow compared with arithmetic operations. However, as data required by a CPU increase, the number of accesses to the memory increases, and as a result, the burden on the memory is increasing. In recent years, computing in-memory structures that perform arithmetic operations in memory in addition to read and write operations are being proposed in order to reduce a bottleneck in the memory, which is an inherent problem of the memory.

SUMMARY

The present disclosure provides a computing in-memory device capable of speeding up arithmetic operations and preventing a data flip phenomenon.

Embodiments of the inventive concept provide a computing in-memory device including a memory cell array supporting a bitwise operation through at least one pair of memory cells activated in response to at least one pair of word line signals and a peripheral circuit connected to the at least one pair of memory cells via one pair of bit lines and performing a discharging operation on at least one bit line of the one pair of bit lines based on a voltage level of the one pair of bit lines.

Embodiments of the inventive concept provide a control operation method supporting a bitwise operation of a computing in-memory device. The method includes allowing a controller to output a precharging signal and a reset signal to an acceleration circuit, allowing the controller to simultaneously output an enable signal and a word line control signal to the acceleration circuit and a word line driver, respectively, and allowing the controller to output the enable signal to the acceleration circuit and to support the bitwise operation.

According to the computing in-memory device and the control operation method of the present disclosure, a pulse signal, which has a voltage level higher than a conventionally used pulse signal and a width shorter than the conventionally used pulse signal, is used. Thus, the operation speed becomes faster than a conventional operation speed, and a data flip phenomenon is prevented.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
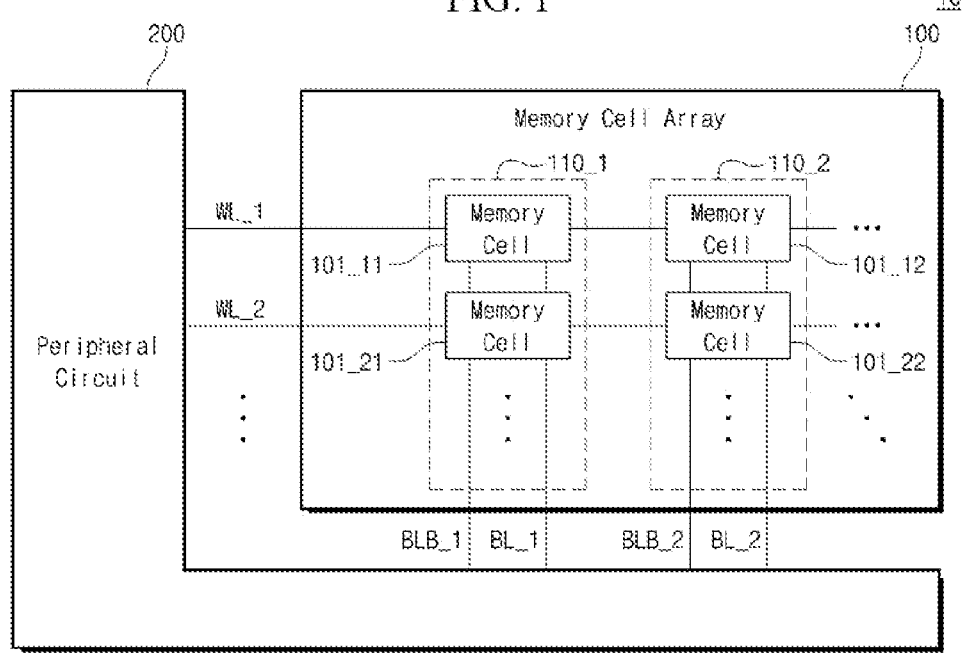
FIG. 1 is a block diagram showing a computing in-memory device according to an embodiment of the present disclosure.

Hereinafter, embodiments of the present disclosure will be described with reference to specific embodiments and the accompanying drawings, However, the embodiments of the present disclosure may be modified in various other forms, and the scope of the present disclosure is not limited to the embodiments described below. In addition, embodiments of the present disclosure are provided to more fully describe the present disclosure to those skilled in the art. Accordingly, the shape and size of elements in the drawings may be exaggerated for a clearer description, and elements indicated by the same reference numerals in the drawings are the same elements.

In addition, in order to clearly describe the present disclosure in the drawings, parts irrelevant to the description are omitted, and thicknesses are enlarged to clearly express various layers and regions, and components having the same function within the scope of the same idea have the same reference. Further, throughout the specification, when a part "includes" a certain component, it means that the component may further include other components, not to exclude other components, unless otherwise stated.

Figure 2:
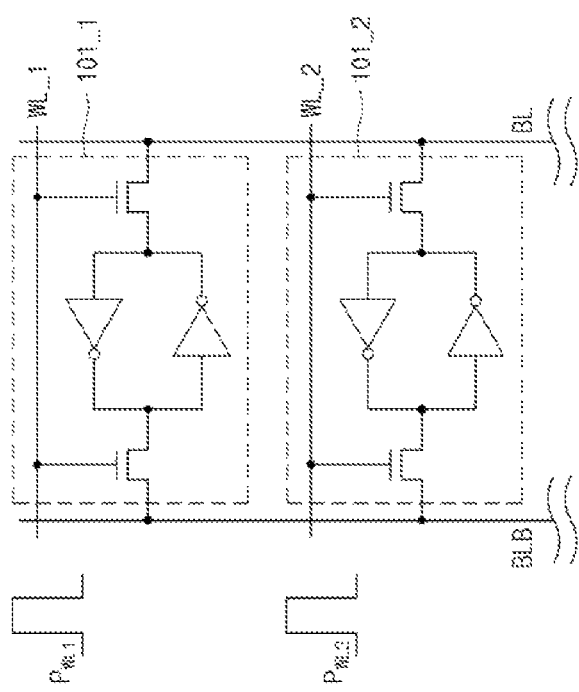
FIG. 2 is a circuit diagram showing at least one pair of memory cells of FIG. 1.
Figure 3:
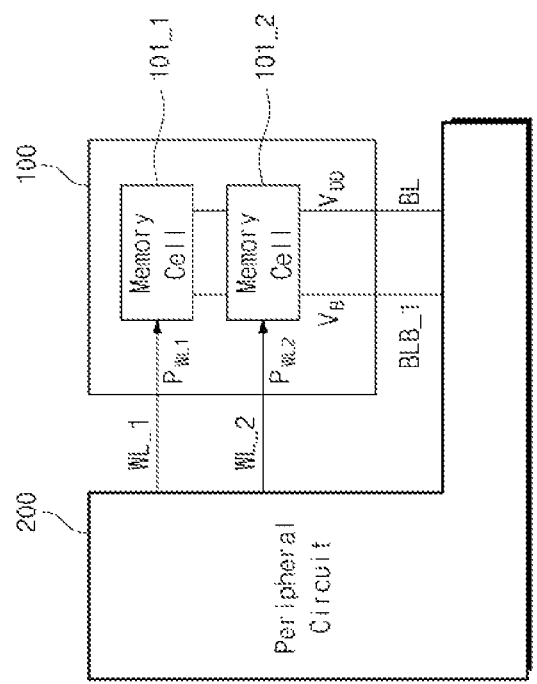
FIG. 3 is a block diagram showing a bitwise operation of the computing in-memory device of FIG. 1.

FIG. 1 is a block diagram showing a computing in-memory device 10 according to an embodiment of the present disclosure, FIG. 2 is a circuit diagram showing at least one pair of memory cells 101_1 and 101_2 of FIG. 1, and FIG. 3 is a block diagram showing a bitwise operation of the computing in-memory device 10 of FIG. 1.

Referring to FIGS. 1 to 3, the computing in-memory device 10 may include a memory cell array 100 and a peripheral circuit 200.

The memory cell array 100 may include a plurality of sub-arrays 110_1 to 110_N arranged in a longitudinal direction of a plurality of word lines WL_1 to WL_N and connected to the word lines WL_1 to WL_N and a plurality of pairs of bit lines BLB_1 to BLB_M and BL_1 to BL_M.

In detail, each of the sub-arrays 110_1 to 110_M may include a plurality of memory cells 101_11 to 101_NM arranged in a longitudinal direction of a pair of bit lines BLB and BL and connected to the pair of bit lines BLB and BL and the word lines WL_1 to WL_N.

That is, since the number of the sub-arrays each including the memory cells 101_11 to 101_NM is M, the memory cell array 100 may include first to N-th memory cells 101_1M to 101_NM. Each of the first to M-th memory cells 101_1M to 101_NM may be, but not limited to, an SRAM (static random access memory) cell including six transistors.

In detail, the first to M-th memory cells 101_1M to 101_NM may be activated in response to a plurality of word line signals $P_{WL1}$ to $P_{WLN}$ applied thereto through the word lines WL_1 to WL_N.

In the present embodiment, the word line signals $P_{WL1}$ to $P_{WLN}$ may be pulse signals each having a level corresponding to a precharging voltage VDD and a width shorter than a period during which the precharging voltage VDD is discharged. Accordingly, the at least one pair of memory cells 101_1 and 101_2 may be rapidly activated by the pulse signal having a voltage level higher than that of a conventional word line signal and a width shorter than that of the conventional word line signal.

According to an embodiment, the memory cell array 100 may support a bitwise operation through at least the one pair of memory cells 101_1 and 101_2 activated by at least one pair of word line signals. In this case, at least the one pair of memory cells 101_1 and 101_2 may be connected to the one pair of bit lines BLB and BL.

As an example, as shown in FIG. 2, the first memory cell 101_1 may be connected to the one pair of bit lines BLB and BL and may be activated in response to a first word line signal $P_{WL1}$ applied thereto through a first word line WL_1. Substantially simultaneously, a second memory cell 101_2 may be connected to the one pair of bit lines BLB and BL and may be activated in response to a second word line signal $P_{WL2}$ applied thereto through a second word line WL_2.

In the present embodiment, the first and second word line signals $P_{WL1}$ and $P_{WL2}$ may be pulse signals having substantially the same level as each other and the same width as each other.

In this case, each bit line BLB and BL may have a voltage level VB that varies from a voltage level of the precharging voltage VDD and corresponds to an output value (NOR or AND) according to the bitwise operation based on data connected to the first and second memory cells 101_1 and 101_2.

For example, as shown in FIG. 3, a first bit line BLB of the one pair of bit lines BLB and BL may have a voltage level that varies from the precharging voltage level VDD to the voltage level VB according to the bitwise operation, and a voltage level of a second bit line BL of the one pair of bit lines BLB and BL may maintain the precharging voltage level VDD according to the bitwise operation.

That is, the memory cell array 100 may support the bitwise operation with respect to the one pair of bit lines BLB and BL through the at least one pair of memory cells 101_1 and 101_2 connected to the one pair of bit lines BLB and BL and activated in response to the at least one pair of word line signals.

Then, the peripheral circuit 200 may be connected to the at least one pair of memory cells 101_1 and 101_2 through the one pair of bit lines BLB and BL and may perform a discharging operation with respect to one bit line based on the voltage level of the one pair of bit lines BLB and BL.

In detail, the peripheral circuit 200 may determine whether each bit line of the one pair of bit lines BLB and BL is an acceleration target based on the voltage level of each bit line of the one pair of bit lines BLB and BL.

For example, in a case where the first bit line BLB has the voltage level smaller by a certain amount than the voltage level of precharging voltage VDD and the second bit line BL has the voltage level corresponding to the voltage level of the precharging voltage VDD, the peripheral circuit 200 may determine the first bit line BLB as the acceleration target and may determine the second bit line BL as a maintenance target.

In this case, the peripheral circuit 200 may receive the data through the one pair of bit lines BLB and BL connected to the at least one pair of memory cells 101_1 and 101_2, and thus, may support the bitwise operation. That is, the peripheral circuit 200 may support the bitwise operation to be performed at a high speed using the data stored in the at least one pair of memory cells 101_1 and 101_2 rapidly activated in response to the at least one pair of word line signals $P_{WL1}$ and $P_{WL2}$ and the one pair of bit lines BLB and BL.

In addition, the peripheral circuit 200 may perform the discharging operation based on results obtained by determining whether each bit line of the one pair of bit lines BLB and BL is the acceleration target.

As an example, in a case where the second bit line BL is determined as the acceleration target, the peripheral circuit 200 may perform the discharging operation on the second bit line BL to prevent the data from being flipped. In addition, in a case where the second bit line BL is determined as the maintenance target, the peripheral circuit 200 may stop the discharging operation performed on the second bit line BL.

According to an embodiment, the peripheral circuit 200 may immediately perform the discharging operation on at least one bit line, for example, BL, in response to a variation in voltage level of one bit line of the one pair of bit lines BLB and BL.

The computing in-memory device 10 according to the embodiment of the present disclosure may use the at least one pair of word line signals having the width shorter than the period during which the precharging voltage is discharged and the voltage level corresponding to that of the precharging voltage, and thus, may speed up the operation to be faster than a speed of a conventional operation, which uses a word line signal with a low voltage level. Further, as the computing in-memory device 10 performs the discharging operation on the at least one bit line BL based on a voltage level of each bit line of the one pair of bit lines BLB and BL, the data flip occurring due to the voltage level of the word line signal may be prevented.

Hereinafter, the peripheral circuit 200 will be described in detail with reference to FIG. 4.

Figure 4:
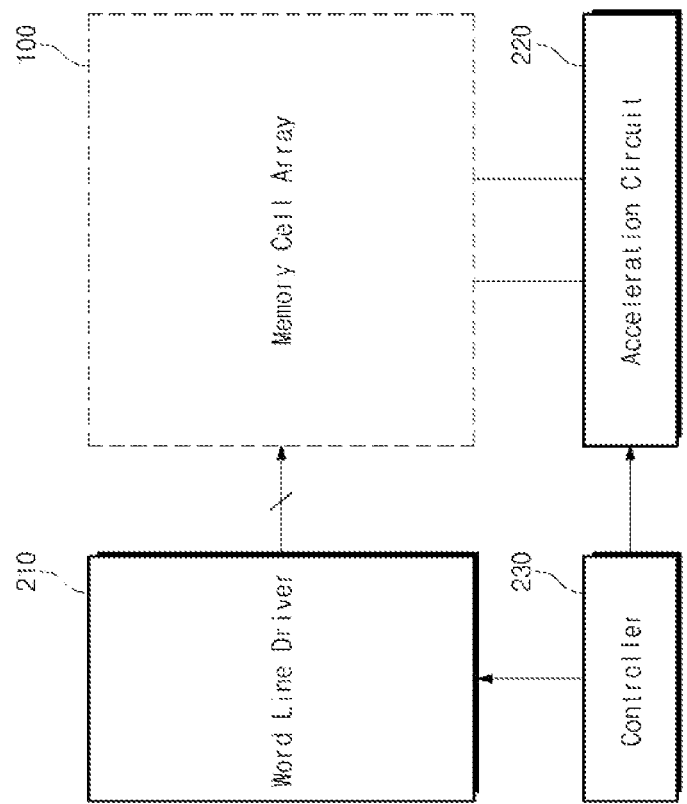
FIG. 4 is a block diagram showing a peripheral circuit of FIG. 1.
Figure 5:
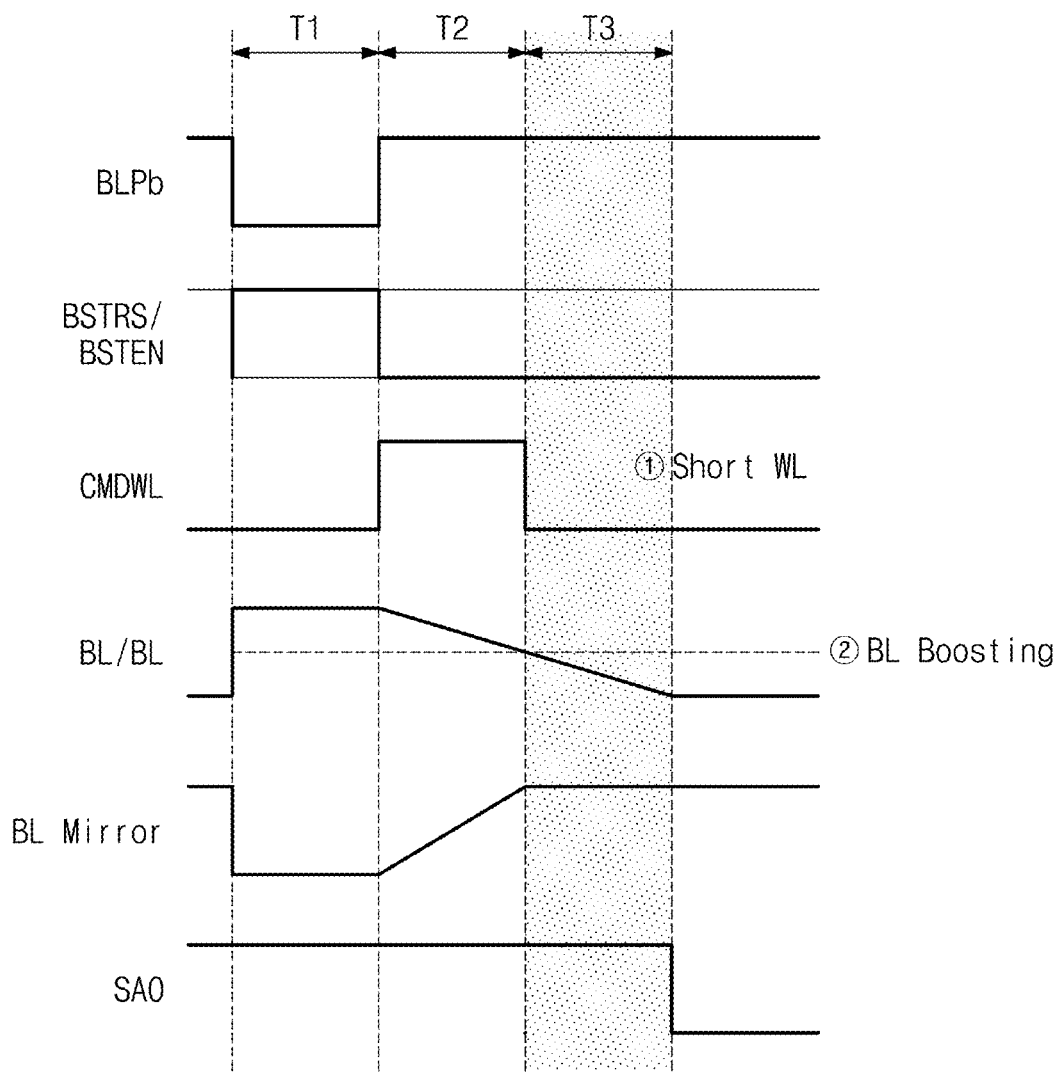
FIG. 5 is a timing diagram showing a control operation of a controller of FIG. 4.

FIG. 4 is a block diagram showing the peripheral circuit 200 of FIG. 1, and FIG. 5 is a timing diagram showing a control operation of a controller 230 of FIG. 4.

Referring to FIGS. 4 and 5, the peripheral circuit 200 may include a word line driver 210, an acceleration circuit 220, and the controller 230.

The word line driver 210 may be connected to the memory cell array 100 through the word lines WL_1 to WL_N. In this case, responsive to a control by the controller 230, the word line driver 210 may substantially simultaneously output at least one pair of word line signals $P_{WL1}$ and $P_{WL2}$ among the word line signals $P_{WL1}$ to $P_{WLN}$ to the memory cell array 100.

Then, the acceleration circuit 220 may be connected to the at least one pair of memory cells 101_1 and 101_2 through the one pair of bit lines BLB and BL. In this case, the acceleration circuit 220 may discharge or precharge the one pair of bit lines BLB and BL in response to the control by the controller 230.

The controller 230 may control the word line driver 210 and the acceleration circuit 220 in the order of first, second, and third operation periods T1, T2, and T3 that are previously determined according to the bitwise operation.

As shown in FIG. 5, the controller 230 may output a precharging signal BLPb and a reset signal BSTRS to the acceleration circuit 220 during the first operation period T1. The precharging signal BLPb may be a signal used to precharge the one pair of bit lines BLB and BL, and the reset signal BSTRS may be a signal used to reset one mirror node Nm.

In this case, during the second operation period T2 following the first operation period T1, the controller 230 may output an enable signal BSTEN to the acceleration circuit 220 and may out a word line control signal CMDWL to the word line driver 210. The enable signal BSTEN may be a signal used to discharge the one pair of bit lines BLB and BL, and the word line control signal CMDWL may be a signal used to control the word line driver 210 such that at least one pair of word line signals is output to the at least one pair of memory cells 101_1 and 101_2.

Then, the controller 230 may output the enable signal BSTEN to the acceleration circuit 220 during the third operation period T3.

That is, the precharging signal BLPb may be in an active state only during the first operation period T1, the reset signal BSTRS may be in the active state only during the first operation period T1, the enable signal BSTEN may be in the active state during the second and third operation periods T2 and T3, and the word line control signal CMDWL may be in the active state only during the second operation period T2.

Figure 6:
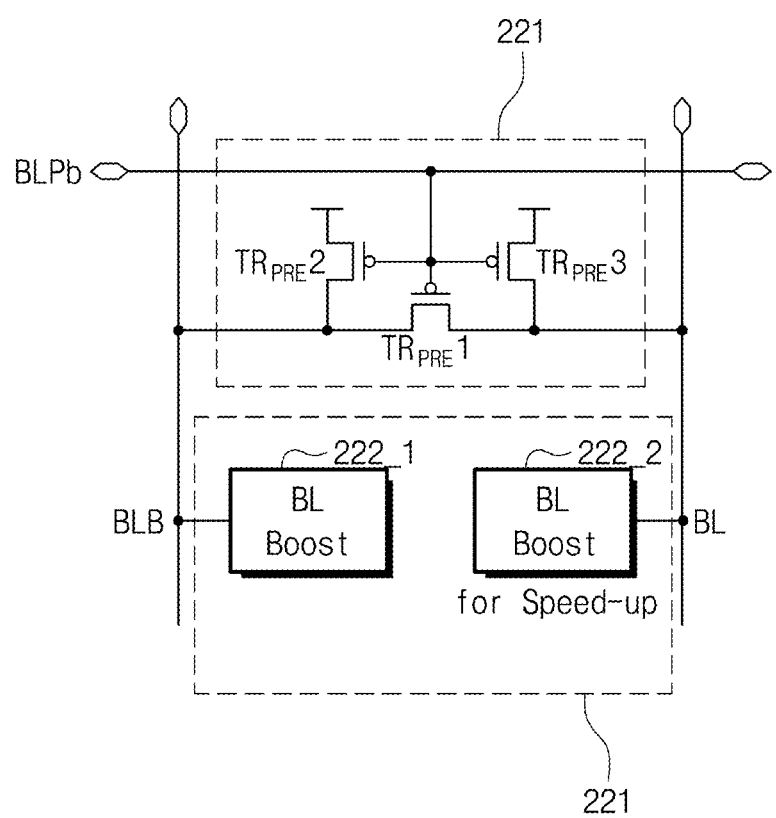
FIG. 6 is a circuit diagram showing an acceleration circuit of FIG. 4.
Figure 7:
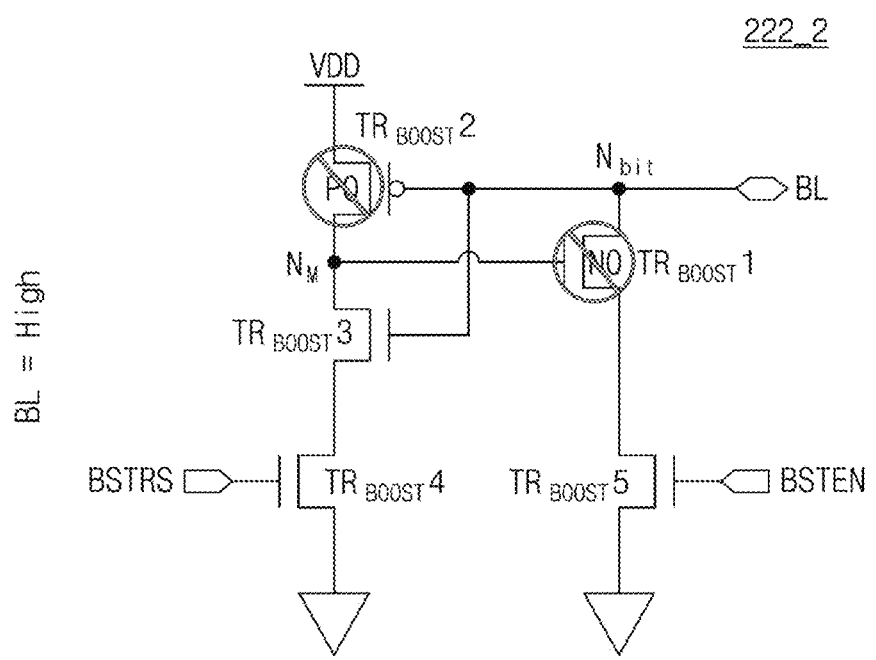
FIG. 7 is a view showing an operation of a booster of FIG. 6 according to an embodiment of the present disclosure.
Figure 8:
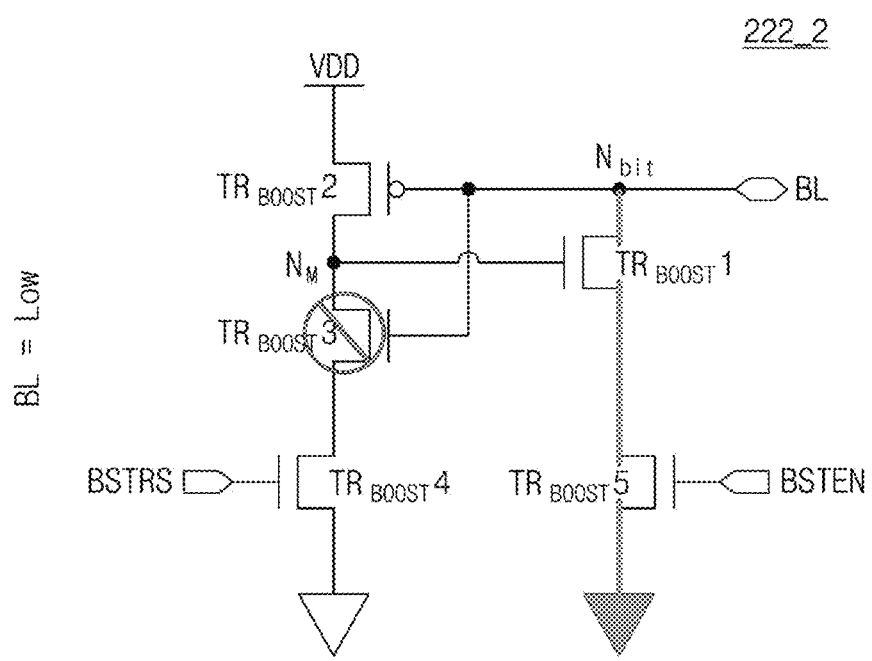
FIG. 8 is a view showing an operation of a booster of FIG. 6 according to another embodiment of the present disclosure.

FIG. 6 is a circuit diagram showing the acceleration circuit 220 of FIG. 4, FIG. 7 is a view showing an operation of a booster 222_2 of FIG. 6 according to an embodiment of the present disclosure, and FIG. 8 is a view showing an operation of the booster 222_2 of FIG. 6 according to another embodiment of the present disclosure.

Referring to FIGS. 6 to 8, the acceleration circuit 220 may include a precharging unit 221 and a booster unit 222.

The precharging unit 221 may precharge the one pair of bit lines BLB and BL through first, second, and third precharging transistors $TR_{PRE}1$, $TR_{PRE}2$, and $TR_{PRE}3$. In the present embodiment, the first to third precharging transistors $TR_{PRE}1$ to $TR_{PRE}3$ may be PMOS transistors whose gates are connected to each other.

In detail, one end of the first precharging transistor $TR_{PRE}1$ may be connected to the first bit line BLB, and the other end of the first precharging transistor $TR_{PRE}1$ may be connected to the second bit line BL. In this case, the first precharging transistor $TR_{PRE}1$ may switch-connect the one pair of bit lines BLB and BL with each other in response to the precharging signal BLPb applied thereto through the controller 230.

In addition, one end of the second precharging transistor $TR_{PRE}2$ may be connected to a voltage source, and the other end of the second precharging transistor $TR_{PRE}2$ may be connected to the first bit line BLB. In this case, the second precharging transistor $TR_{PRE}2$ may switch-connect the voltage source and the first bit line BLB with each other in response to the precharging signal BLPb applied thereto through the controller 230.

In addition, one end of the third precharging transistor $TR_{PRE}3$ may be connected to the voltage source, and the other end of the third precharging transistor $TR_{PRE}3$ may be connected to the second bit line BL. In this case, the third precharging transistor $TR_{PRE}3$ may switch-connect the voltage source VDD and the second bit line BL with each other in response to the precharging signal BLPb applied thereto through the controller 230.

That is, the precharging unit 221 may apply the precharging voltage to the one pair of bit lines BLB and BL through the first to third precharging transistors $TR_{PRE\_1}$ to $TR_{PRE\_3}$ from the voltage source VDD, which is used to apply the precharging voltage, based on the precharging signal BLPb.

The booster unit 222 may discharge the one pair of bit lines BLB and BL in parallel through first and second boosters 222_1 and 222_2.

In the present embodiment, each of the first and second boosters 222_1 and 222_2 may include first, second, third, fourth, and fifth boost transistors $TR_{BOOST}1$, $TR_{BOOST}2$, $TR_{BOOST}3$, $TR_{BOOST}4$, and $TR_{BOOST}5$. Hereinafter, the second booster 222_2 connected to the second bit line BL will be used as a representative example to describe the first to fifth boost transistors $TR_{BOOST}1$ to $TR_{BOOST}5$.

In detail, one end of the first boost transistor $TR_{BOOST}1$ may be connected to one bit line, and a gate of the first boost transistor $TR_{BOOST}1$ may be connected to the mirror node Nm between the second and third boost transistors $TR_{BOOST}2$ and $TR_{BOOST}3$. In the present embodiment, the first boost transistor $TR_{BOOST}1$ may be implemented as an NMOS transistor.

As an example, the first booster 222_1 may include the first boost transistor $TR_{BOOST}1$ connected to the first bit line, and the second booster 222_2 may include the first boost transistor $TR_{BOOST}1$ connected to the second bit line.

In addition, one end of the second boost transistor $TR_{BOOST}2$ may be connected to the voltage source VDD, and the other end of the second boost transistor $TR_{BOOST}2$ may be connected to the mirror node Nm. In the present embodiment, the second boost transistor $TR_{BOOST}2$ may be implemented as a PMOS transistor.

According to an embodiment, the first, second, and fifth boost transistors $TR_{BOOST}1$, $TR_{BOOST}2$, and $TR_{BOOST}5$ may have a threshold voltage lower than that of the third and fourth boost transistors $TR_{BOOST}3$ and $TR_{BOOST}4$.

In addition, one end of the third boost transistor $TR_{BOOST}3$ may be connected to the mirror node Nm, and the other end of the third boost transistor $TR_{BOOST}3$ may be connected to one end of the fourth boost transistor $TR_{BOOST}4$. In the present embodiment, the third boost transistor $TR_{BOOST}3$ may be implemented as the NMOS transistor.

As gates of the second and third boost transistors $TR_{BOOST}2$ and $TR_{BOOST}3$ are connected to a bit line node Nbit at which the one end of the first boost transistor $TR_{BOOST}1$ intersects with one bit line, a current mirror operation of the mirror node Nm may be performed on the bit line node Nbit.

In addition, one end of the fourth boost transistor $TR_{BOOST}4$ may be connected to the other end of the third boost transistor $TR_{BOOST}3$, and the other end of the fourth boost transistor $TR_{BOOST}4$ may be grounded. In the present embodiment, the fourth boost transistor $TR_{BOOST}4$ may be implemented as the NMOS transistor.

In this case, the fourth boost transistor $TR_{BOOST}4$ may switch-connect the other end of the third boost transistor $TR_{BOOST}3$ and a ground with each other in response to the reset signal BSTRS applied thereto from the controller 230.

In addition, one end of the fifth boost transistor $TR_{BOOST}5$ may be connected to the other end of the first boost transistor $TR_{BOOST}1$, and the other of the fifth boost transistor $TR_{BOOST}5$ may be grounded. In the present embodiment, the fifth boost transistor $TR_{BOOST}5$ may be implemented as the NMOS transistor.

The fifth boost transistor $TR_{BOOST}5$ may switch-connect the other end of the first boost transistor $TR_{BOOST}1$ and the ground with each other in response to the enable signal BSTEN applied thereto from the controller 230.

According to an embodiment, in a case where a voltage level of the bit line node Nbit is at a high state corresponding to the voltage level of the precharging voltage VDD, the third boost transistor $TR_{BOOST}3$ may be switched on, and the first and second boost transistors $TR_{BOOST}1$ and $TR_{BOOST}2$ may be switched off.

As shown in FIG. 7, when the voltage level of the bit line node Nbit is at the high state corresponding to the voltage level of the precharging voltage VDD, the first and second boost transistors $TR_{BOOST}1$ and $TR_{BOOST}2$ may be switched off, and thus, the voltage level with respect to the one bit line may be maintained.

According to another embodiment, in a case where the voltage level of the bit line node Nbit is at a low state smaller than the voltage level of the precharging voltage VDD, the first to third boost transistors $TR_{BOOST}1$ to $TR_{BOOST}3$ may be switched on.

As shown in FIG. 8, in the case where the voltage level of the bit line node Nbit is smaller than the voltage level of the precharging voltage VDD, the first to third boost transistors $TR_{BOOST}1$ to $TR_{BOOST}3$ may be switched on, and thus, the voltage level with respect to the one bit line may be adjusted to a ground voltage level by the enable signal provided for the fifth operation period.

Figure 9:
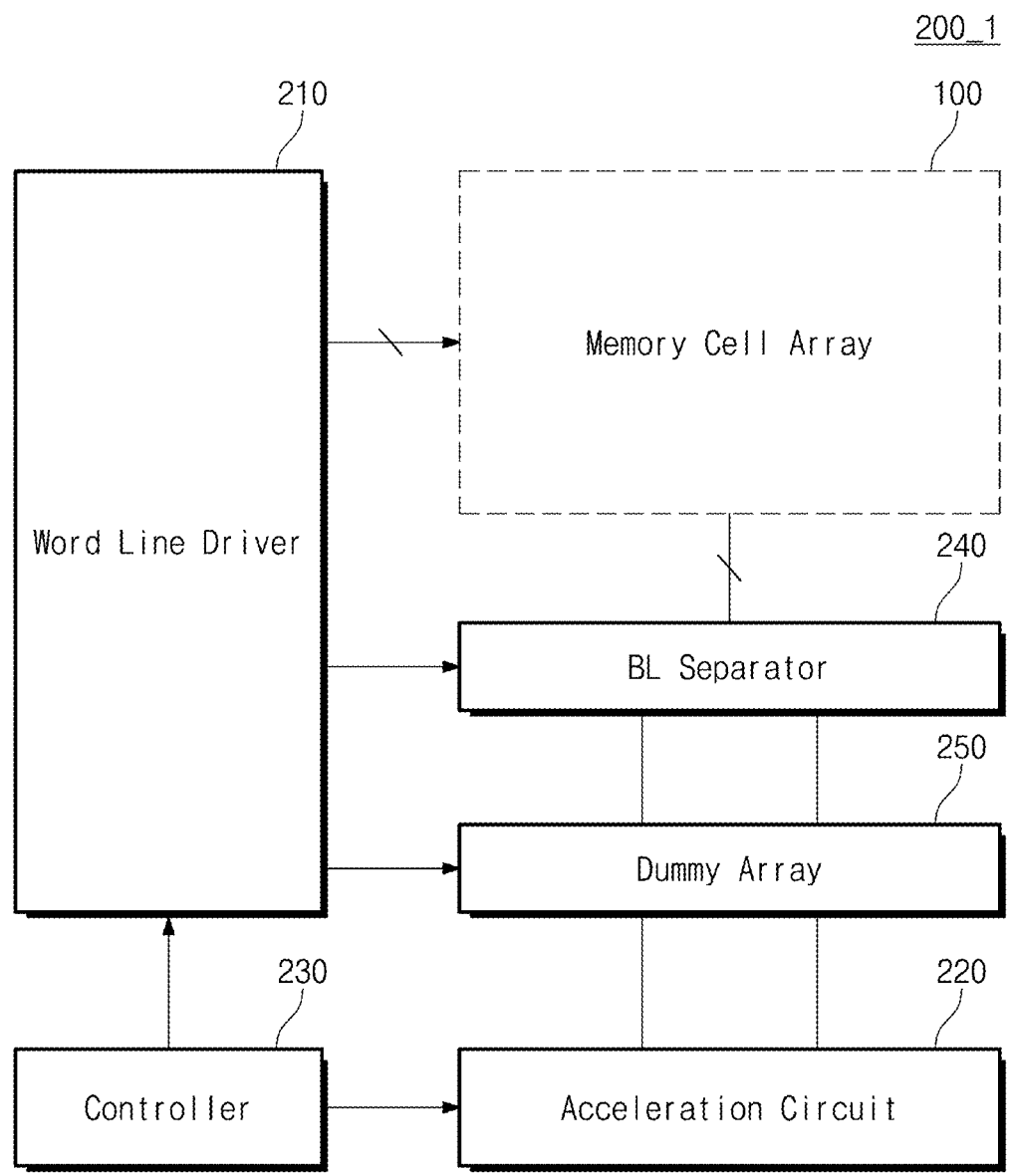
FIG. 9 is a block diagram showing a peripheral circuit of FIG. 4.

FIG. 9 is a block diagram showing a peripheral circuit 200_1 of FIG. 4.

Referring of FIGS. 1 to 9, the peripheral circuit 200_1 may include a word line driver 210, an acceleration circuit 220, a controller 230, a bit line (BL) separator 240, and a dummy array 250. Hereinafter, redundant descriptions of the word line driver 210, the acceleration circuit 220, and the controller 230 assigned with the same reference numerals as those described in FIGS. 1 to 7 will be omitted.

The BL separator 240 may be disposed between the memory cell array 100 and the acceleration circuit 220. The dummy array 250 may be disposed between the BL separator 240 and the acceleration circuit 220.

Figure 10:
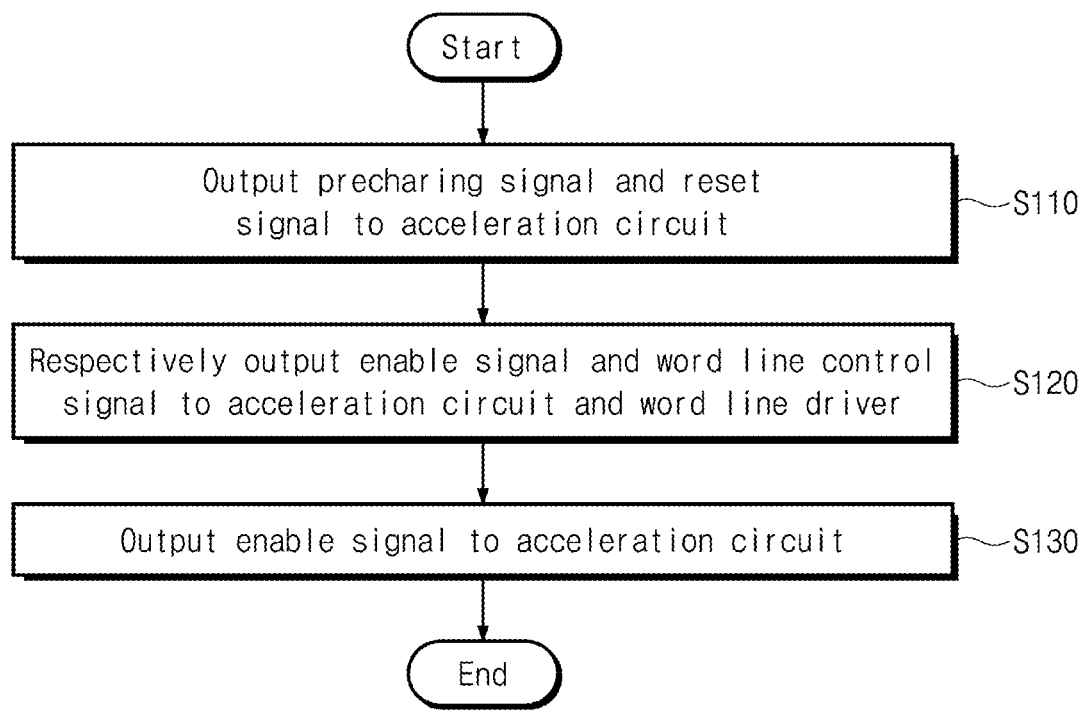
FIG. 10 is a flowchart showing a control operation method to support a bitwise operation of the computing in-memory device of FIG. 1.

FIG. 10 is a flowchart showing a control operation method to support the bitwise operation of the computing in-memory device 10 of FIG. 1.

Referring to FIGS. 1 to 5 and 10, the controller 230 may output the precharging signal BLPb and the reset signal BSTRS to the acceleration circuit 220 (S110).

Then, the controller 230 may output the enable signal BSTEN to the acceleration circuit 220 and substantially simultaneously may output the word line control signal CMDWL to the word line driver 210 (S120).

According to the embodiment, the word line driver 210 may output the at least one pair of word line signals $P_{WL1}$ and $P_{WL2}$ to the at least one pair of memory cells 101_1 and 101_2 connected to the one pair of bit lines BLB and BL based on the word line control signal CMDWL (S120).

The controller 230 may output the enable signal BSTEN to the acceleration circuit 220 to support the bitwise operation (S130).

Although the embodiments of the present disclosure have been described with reference to the accompanying drawings, the present disclosure should not be limited to the above-illustrated embodiments, and various kinds of modifications and variations may be added to the embodiments within the same or equal scope of the present disclosure by one skilled in the art. However, even if the working effect of the invention is not disclosed in the specification, the effect still can be considered in assessing inventiveness if the effect can be inferred from the descriptions in the specification.

What is claimed is:

1. A computing in-memory device comprising:
a memory cell array supporting a bitwise operation through at least one pair of memory cells activated in response to at least one pair of word line signals; and
a peripheral circuit connected to the at least one pair of memory cells via one pair of bit lines and performing a discharging operation on at least one bit line of the one pair of bit lines based on a voltage level of the one pair of bit lines,
wherein the peripheral circuit comprises a controller controlling the word line driver and the acceleration circuit in the order of first, second, and third operation periods that are previously determined according to the bitwise operation, and
wherein the controller outputs a precharging signal to precharge the one pair of bit lines and a reset signal to reset one mirror node to the acceleration circuit during the first operation period.

2. The computing in-memory device of claim 1, wherein the peripheral circuit determines whether each of the one pair of bit lines is an acceleration target based on the voltage level of the one pair of bit lines.

3. The computing in-memory device of claim 2, wherein the peripheral circuit performs the discharging operation when the one bit line is determined as the acceleration target and stops the discharging operation when the one bit line is determined as a maintenance target.

4. The computing in-memory device of claim 1, wherein each of the at least one pair of word line signals is a pulse signal having a width shorter than a period during which a precharging voltage is discharged and a level corresponding to a precharging voltage level.

5. The computing in-memory device of claim 1, wherein the peripheral circuit comprises:
a word line driver connected to the memory cell array through a plurality of word lines; and
an acceleration circuit connected to the at least one pair of memory cells through the one pair of bit lines.

6. The computing in-memory device of claim 5, wherein the controller outputs an enable signal to the acceleration circuit during the second operation period to discharge the one pair of bit lines.

7. The computing in-memory device of claim 6, wherein the controller outputs a word line control signal to the word line driver during the second operation period to control the word line driver.

8. The computing in-memory device of claim 7, wherein the controller outputs the enable signal to the acceleration circuit during the third operation period.

9. The computing in-memory device of claim 5, wherein the acceleration circuit comprises:
first, second, and third precharging transistors to precharge the one pair of bit lines; and first and second boosters to discharge the one pair of bit lines.

10. The computing in-memory device of claim 9, wherein each of the first and second boosters comprises:
- a first boost transistor in which one end is connected to one bit line;
- a second boost transistor in which a gate is connected to the one end of the first boost transistor and one end is connected to a voltage source;
- a third boost transistor in which a gate is connected to the one end of the first boost transistor and one end is connected to the other end of the second boost transistor;
- a fourth boost transistor switch-connecting the other end of the third boost transistor and a ground with each other in response to a reset signal; and
- a fifth boost transistor switch-connecting the other end of the first boost transistor and the ground with each other in response to an enable signal.

11. The computing in-memory device of claim 10, wherein each of the first, third, and fifth boost transistors is an NMOS transistor, and the second boost transistor is a PMOS transistor.

12. The computing in-memory device of claim 10, wherein the first, second, and third boost transistors are switched on when a voltage level of a bit line node at which the one bit line intersects with the one end of the first boost transistor is smaller than a precharging voltage.

13. The computing in-memory device of claim 12, wherein, when the voltage level of the bit line node corresponds to the precharging voltage, the first and second boost transistors are switched off, and the third boost transistor is switched on.

14. The computing in-memory device of claim 5, wherein the peripheral circuit further comprises:
- a bit line separator disposed between the memory cell array and the acceleration circuit; and
- a dummy array disposed between the bit line separator and the acceleration circuit.

15. A control operation method supporting a bitwise operation of the computing in-memory device of claim 1, comprising:
- allowing a controller to output a precharging signal and a reset signal to an acceleration circuit;
- allowing the controller to simultaneously output an enable signal and a word line control signal to the acceleration circuit and a word line driver, respectively; and
- allowing the controller to output the enable signal to the acceleration circuit and to support the bitwise operation.

16. The method of claim 15, wherein the outputting of the word line control signal to the word line driver comprises allowing the word line driver to output at least one pair of word line signals to at least one pair of memory cells connected to one pair of bit lines based on the word line control signal.

17. The method of claim 16, wherein each of the at least one pair of word line signals is a pulse signal having a width shorter than a period during which a precharging voltage is discharged and a level corresponding to a precharging voltage level.

18. A computing in-memory device comprising:
- a memory cell array supporting a bitwise operation through at least one pair of memory cells activated in response to at least one pair of word line signals; and
- a peripheral circuit connected to the at least one pair of memory cells via one pair of bit lines and performing a discharging operation on at least one bit line of the one pair of bit lines based on a voltage level of the one pair of bit lines,
- wherein the peripheral circuit comprises an acceleration circuit connected to the at least one pair of memory cells through the one pair of bit lines, and
- wherein the peripheral circuit further comprises:
- a bit line separator disposed between the memory cell array and the acceleration circuit; and
- a dummy array disposed between the bit line separator and the acceleration circuit.

* * * * *